(12) United States Patent
Chang et al.

(10) Patent No.: US 11,139,697 B2
(45) Date of Patent: Oct. 5, 2021

(54) FOREIGN OBJECT DETECTION METHOD AND POWER SYSTEM CAPABLE OF DETECTING FOREIGN OBJECT

(71) Applicant: RICHTEK TECHNOLOGY CORPORATION, Zhubei (TW)

(72) Inventors: Wei-Hsu Chang, Hsinchu (TW); Shang-Hung Hsieh, New Taipei (TW)

(73) Assignee: RICHTEK TECHNOLOGY CORPORATION, Hsinchu (TW)

( * ) Notice: Subject to any disclaimer, the term of this patent is extended or adjusted under 35 U.S.C. 154(b) by 296 days.

(21) Appl. No.: 16/532,382

(22) Filed: Aug. 5, 2019

(65) Prior Publication Data

US 2020/0112206 A1 Apr. 9, 2020

Related U.S. Application Data

(60) Provisional application No. 62/742,891, filed on Oct. 8, 2018.

(30) Foreign Application Priority Data

Apr. 30, 2019 (CN) .......................... 201910363181.7

(51) Int. Cl.
*H02J 50/60* (2016.01)
*H02J 5/00* (2016.01)
(Continued)

(52) U.S. Cl.
CPC .......... *H02J 50/60* (2016.02); *G01R 31/085* (2013.01); *G01R 31/52* (2020.01); *G01R 31/66* (2020.01); *G05B 19/0428* (2013.01); *H01F 38/14* (2013.01); *H02J 5/005* (2013.01); *H02J 7/025* (2013.01)

(58) Field of Classification Search
CPC . H02J 50/60; H02J 7/025; H02J 5/005; G01R 31/52; G01R 31/66; G01R 31/085; G05B 19/0428; H01F 38/14; G06F 1/28; G06F 1/30; G06F 1/266
See application file for complete search history.

(56) References Cited

U.S. PATENT DOCUMENTS

| | | | |
|---|---|---|---|
| 2006/0091858 A1* | 5/2006 | Johnson | H02J 7/00 320/128 |
| 2013/0018597 A1* | 1/2013 | Gofman | A61B 5/14532 702/23 |
| 2017/0294832 A1* | 10/2017 | Aoki | H01R 24/64 |

* cited by examiner

*Primary Examiner* — Hal Kaplan
*Assistant Examiner* — Thai H Tran
(74) *Attorney, Agent, or Firm* — Tung & Associates

(57) ABSTRACT

A power system capable of detecting a foreign object includes a power supplier side, a power receiver side and a cable. The power supplier side includes a power control switch, a power control circuit and a pull-up circuit. The power control circuit controls the power control switch to provide a supply voltage to the power receiver side. The pull-up circuit provides a supplier transmission current to generate a supplier transmission voltage for determining whether the power supplier side and the power receiver side are coupled properly. The power control circuit determines whether a foreign object exists between the power supplier side and the power receiver side according to a voltage difference of the supplier transmission voltage before and after the supply voltage VBUS is provided. The power control circuit adaptively controls the power control switch and adjusts the transmission current according to whether a foreign object exists.

23 Claims, 15 Drawing Sheets

(51) Int. Cl.
*H02J 7/02* (2016.01)
*H01F 38/14* (2006.01)
*G05B 19/042* (2006.01)
*G01R 31/08* (2020.01)
*G01R 31/66* (2020.01)
*G01R 31/52* (2020.01)

FOREIGN OBJECT DETECTION METHOD AND POWER SYSTEM CAPABLE OF DETECTING FOREIGN OBJECT

CROSS REFERENCE

The present invention claims priority to U.S. 62/742,891, filed on Oct. 8, 2018, and to CN 201910363181.7, filed on Apr. 30, 2019.

BACKGROUND OF THE INVENTION

Field of Invention

The present invention relates to a foreign object detection method and a power system capable of detecting foreign objects. In particular, the present invention relates to a foreign object detection method and a power system having foreign object detection capability, in which the level of the current supplied from a supplier communication node of a power supplier side to a power receiver side is adaptively adjusted according to whether a foreign object is detected to exist at the receiver side, such that a rust or damage can be prevented.

Description of Related Art

FIGS. 1A-1C show a prior art power system and possible problems, respectively.

As shown in FIGS. 1A-1C, each of the prior art power systems 100a, 100b and 100c includes a power supplier 10, a cable 70 and an electronic device 20. In the prior art power systems 100a, 100b and 100c, the power supplier 10 and the electronic device 20 are coupled to each other through the cable 70. The power supplier 10 at least includes a power control switch (not shown), and the electronic device 20 at least includes a load (not shown). The cable 70 includes a positive power transmission line 71, a negative power transmission line 73, and a signal transmission line 72. When the power supplier 10 (power supplier side) and the electronic device 20 (power receiver side) are coupled to each other through the cable 70, the positive power transmission line 71 and the negative power transmission line 73 form a loop and thus are capable of delivering power.

The prior art power systems 100a, 100b and 100c may have undesirable errors: When a foreign object (which may be a solid object such as dust or a liquid object such as moisture) or rust exists in the current loop, such as in the power transmission line or signal transmission line, or between the lines, the equivalent resistance is changed. Hence, the present invention detects whether a foreign object or rust exists, by detecting a change of the equivalent resistance, so that a countermeasure can be taken.

When there is a foreign object (or rust; in the following text, rust will be regarded as one form of the foreign object), for example at the connection port of the electronic device 20 for connection with the signal transmission line 72 of the cable 70, it is possible that a resistance at the power receiver side is caused to change, such as at the connection port of the receiver communication node CCR, or between the transmission lines, which are shown by the foreign object resistance Rf and the contact resistance Rcont in the figures. When such an abnormal condition occurs, if the power supplier 10 continues supplying high level current to the electronic device 20, the connection port or the transmission line may be damaged by overheat, or an electrolysis reaction may be triggered to rust the connection port or the transmission line; in a severe case it could be dangerous and the electronic device 20 may be severely damaged. FIGS. 1A-1C show different examples of the undesirable errors.

In the power system 100a of FIG. 1A, the foreign object resistance Rf or the contact resistance Rcont is located at a position in series connection with the pull-down resistor Rd. In this case, the connection port of the receiver communication node CCR may show an abnormally high resistance which is higher than that defined in a transmission interface specification (such as USB PD specification).

In the power system 100b of FIG. 1B, the contact resistance Rcont is located at a position in series connection with the pull-down resistor Rd, and the foreign object resistance Rf is connected to ground. In this case, the connection port of the receiver communication node CCR may show an abnormally high or abnormally low resistance which is higher or lower than that defined in a transmission interface specification.

In the power system 100c of FIG. 1C, the contact resistance Rcont is located at a position in series connection with the pull-down resistor Rd, and the foreign object resistance Rf is connected to the supply voltage VBUS. In this case, the connection port of the receiver communication node CCR may show an abnormally high or abnormally low resistance which is higher or lower than that defined in a transmission interface specification.

The abnormal conditions shown in the prior art power systems 100a, 100b and 100c should be properly taken care of; otherwise, heat or rust may be generated to cause danger or to damage the electronic device 20.

In view of the above, the present invention provides a foreign object detection method and a power system having foreign object detection capability, in which the level of the current supplied from a supplier communication node of a power supplier side to a power receiver side is adaptively adjusted according to whether a foreign object is detected to exist between the power supplier side and the power receiver side, such that a rust or damage can be prevented.

SUMMARY OF THE INVENTION

From one perspective, the present invention provides a foreign object detection method for detecting whether a foreign object exists at or between coupling nodes of a power supplier side and a power receiver side, wherein the power supplier side and the power receiver side are configured to be coupled with each other through a cable which includes a power transmission line and a signal transmission line, the power supplier side having a supplier power node and a supplier communication node and the power receiver side having a receiver power node and a receiver communication node, wherein the power transmission line is configured to transmit power between the supplier power node and the receiver power node, and the signal transmission line is configured to transmit a communication signal between the supplier communication node and the receiver communication node, the supplier communication node having a supplier transmission voltage, and the power receiver side including a pull-down resistor coupled to the receiver communication node, wherein the coupling nodes includes the supplier power node, the supplier communication node, the receiver power node, and the receiver communication node; the method comprising: (S200) providing a first current to the supplier communication node to generate the supplier transmission voltage according to the pull-down resistor, wherein whether the power supplier side and the power receiver side are properly coupled with each other is determined according to the supplier transmission voltage; and (S300) providing a supply voltage to the supplier power node; and determining whether a foreign object exists between the coupling nodes according to a voltage difference of the supplier transmission voltage before and after the supply voltage is provided, or determining whether a foreign object exists between the coupling nodes according to a voltage difference of the supplier transmission voltage before and after the supply voltage is stopped being provided.

In one embodiment, the foreign object detection method further comprises: (S400) when the step (S300) determines that a foreign object exists between the coupling nodes, performing a protection operation.

In one embodiment, the step (S300) includes: when the supplier transmission voltage is raised as the supply voltage is provided, determining that a foreign object exists between the coupling nodes; or when the supplier transmission voltage is lowered as the supply voltage is stopped being provided, determining that a foreign object exists between the coupling nodes.

In one embodiment, the step (S300) includes: (S310) determining whether the power supplier side and the power receiver side are properly coupled with each other according to the supplier transmission voltage; (S320) when the step (S310) determines that the power supplier side and the power receiver side are properly coupled with each other, recording the supplier transmission voltage at this moment as a first voltage, and entering step (S330); (S330) providing the supply voltage to the supplier power node, and entering step (S340); (S340) recording the supplier transmission voltage at this moment as a second voltage, and entering step (S350); and (S350) determining whether a foreign object exists between the coupling nodes by determining whether a voltage difference between the second voltage and the first voltage is larger than a difference threshold.

In one embodiment, the step (S400) includes: (S410) stopping providing the supply voltage to the supplier power node.

In one embodiment, the step (S400) further includes: (S420) providing a second current to the supplier communication node, wherein an average current level of the second current is smaller than a level of the first current.

In one embodiment, the second current is a constant current.

In one embodiment, the second current is a pulsating current.

In one embodiment, the first current is provided via a pull-up current source or a pull-up resistor of the power supplier side.

In one embodiment, the first current and/or the second current are/is provided via a pull-up current source or a pull-up resistor of the power supplier side.

In one embodiment, the foreign object detection method further comprises: (S500) after the step (S400), determining whether the power supplier side and the power receiver side are properly coupled with each other according to the supplier transmission voltage; and when the step (S500) determines that the power supplier side and the power receiver side are properly coupled with each other, repeating the step (S500), or when the step (S500) determines that the power supplier side and the power receiver side are not properly coupled with each other, returning to the step (S200) or a step before the step (S200).

In one embodiment, the step (S400) further includes: (S411) configuring a protection counter, wherein when the step (S300) determines that a foreign object exists between the coupling nodes, the protection counter starts counting; and (S412) when a count of the protection counter reaches a counting threshold, entering the step (S420), otherwise entering the step (S500).

In one embodiment, the foreign object detection method further comprises: (S100) before the step (S200), providing the second current, and preliminarily determining whether the power supplier side and the power receiver side are properly coupled with each other according to the supplier transmission voltage; wherein when the step (S100) preliminarily determines that the power supplier side and the power receiver side are properly coupled with each other, entering the step (S200), otherwise repeating the step (S100).

From another perspective, the present invention provides a power system capable of detecting foreign object, comprising: a power supplier side and a power receiver side which are configured to be coupled with each other through a cable which includes a power transmission line and a signal transmission line, the power supplier side having a supplier power node and a supplier communication node and the power receiver side having a receiver power node and a receiver communication node, wherein the power transmission line is configured to transmit power between the supplier power node and the receiver power node, and the signal transmission line is configured to transmit a communication signal between the supplier communication node and the receiver communication node, the supplier communication node having a supplier transmission voltage, and the power receiver side including a pull-down resistor coupled to the receiver communication node, wherein the coupling nodes includes the supplier power node, the supplier communication node, the receiver power node, and the receiver communication node; the power supplier side including: a power control switch, configured to operably provide a supply voltage to the power receiver side according to a power control signal; a pull-up circuit, configured to adaptively adjust a level of a transmission current provided from the supplier communication node to the power receiver side according to a transmission control signal; and a power control circuit, configured to operably generate the power control signal to control the power control switch and generate the transmission control signal to control the pull-up circuit, wherein the power control circuit controls the power system according to the following steps: (S200) controlling the level of the transmission current to a first current level to generate the supplier transmission voltage on the supplier communication node according to the pull-down resistor, wherein whether the power supplier side 10 and the power receiver side 20 are properly coupled with each other is determined according to the supplier transmission voltage; and (S300) providing a supply voltage to the supplier power node; and determining whether a foreign object exists between the coupling nodes according to a voltage difference of the supplier transmission voltage before and after the supply voltage is provided, or determining whether a foreign object exists between the coupling nodes according to a voltage difference of the supplier transmission voltage before and after the supply voltage is stopped being provided.

In one embodiment, the power control circuit further controls the power system according to the following steps: (S400) when the step (S300) determines that a foreign object exists between the coupling nodes, performing a protection operation.

In one embodiment, the step (S400) further includes: (S420) controlling an average current level of the transmission current to a second current level, wherein the second current level is smaller than the first current level.

In one embodiment, when controlling the average current level of the transmission current to the second current level, the transmission current is a constant current.

In one embodiment, when controlling the average current level of the transmission current to the second current level, the transmission current is a pulsating current.

In one embodiment, the transmission current is provided via a pull-up current source or a pull-up resistor of the power supplier side.

In one embodiment, the power control circuit further controls the power system according to the following steps: (S500) after the step (S400), determining whether the power supplier side and the power receiver side are properly coupled with each other according to the supplier transmission voltage; and when the step (S500) determines that the power supplier side and the power receiver side are properly coupled with each other, repeating the step (S500); or when the step (S500) determines that the power supplier side and the power receiver side are not properly coupled with each other, returning to the step (S200) or a step before the step (S200).

In one embodiment, the power control circuit includes a protection counter, the step (S400) further including: (S411) when the step (S300) determines that a foreign object exists between the coupling nodes, the protection counter starting counting; and (S412) when a count of the protection counter reaches a counting threshold, entering the step (S420), otherwise entering the step (S500).

In one embodiment, the power control circuit further controls the power system according to the following steps: (S100) before the step (S200), controlling the average current level of the transmission current to the second current level, and preliminarily determining whether the power supplier side and the power receiver side are properly coupled with each other according to the supplier transmission voltage; wherein when the step (S100) preliminarily determines that the power supplier side and the power receiver side are properly coupled with each other, entering the step (S200), otherwise repeating the step (S100).

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the circuits and the signal waveforms, but not drawn according to actual scale.

Figure 2:
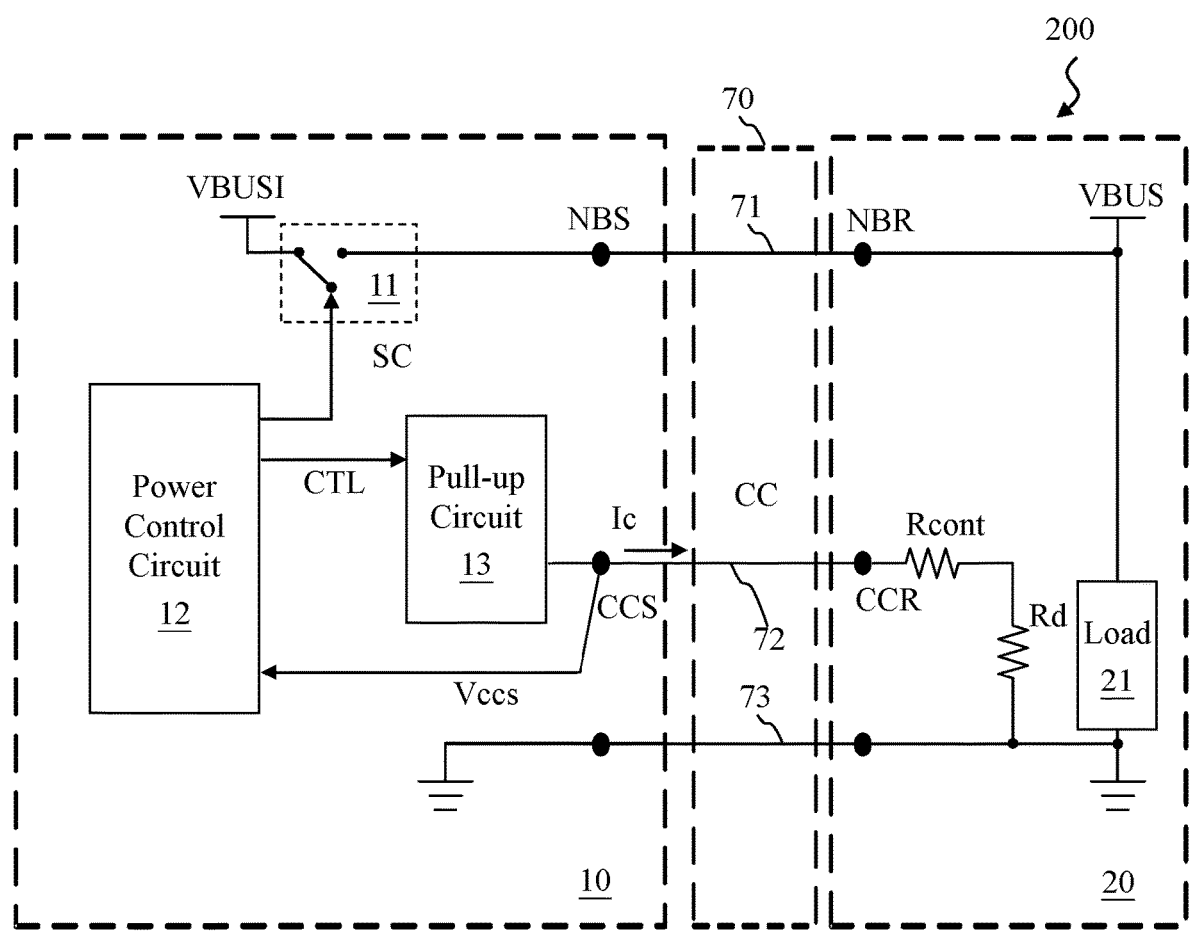
FIG. 2 shows an embodiment of a power system capable of detecting the existence of a foreign object according to the present invention.
Figure 4:
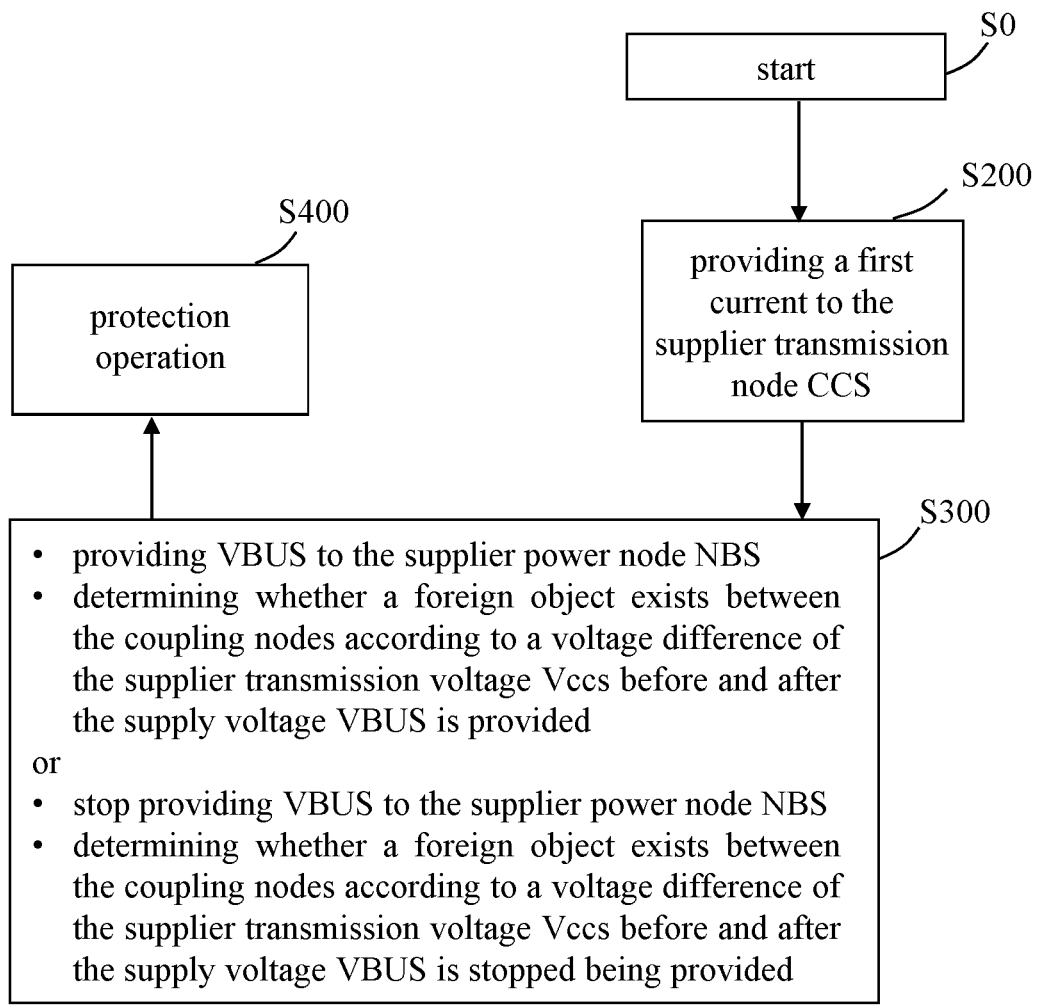
FIG. 4 shows a process flow of an embodiment of a foreign object detection method according to the present invention.

FIG. 2 shows an embodiment of a power system capable of detecting the existence of a foreign object according to the present invention. FIG. 4 shows a process flow of an embodiment of a foreign object detection method according to the present invention.

As shown in FIG. 2, in this embodiment, the foreign object detection method can be employed for example in a power system 200 so that the power system 200 is capable of detecting whether a foreign object exists. The power system 200 which is capable of detecting whether a foreign object exists comprises a cable 70, a power supplier side 10 and a power receiver side 20, which form a power delivery loop. The power supplier side 10 and the power receiver side 20 are configured to be coupled with each other through the cable 70 which transfers power from the power supplier side 10 to the power receiver side 20. In this embodiment, the power supplier side 10 has a supplier power node NBS and a supplier communication node CCS, and the power receiver side 20 has a receiver power node NBR and a receiver communication node CCR. A power transmission line 71 of the cable 70 transmits power between the supplier power node NBS and the receiver power node NBR. A signal transmission line 72 of the cable 70 transmits a communication signal CC between the supplier communication node CCS and the receiver communication node CCR. The supplier communication node CCS has a supplier transmission voltage Vccs. The power receiver side 20 includes a pull-down resistor Rd coupled to the receiver communication node CCR. According to the present invention, a foreign object existing between coupling nodes between the power supplier side 10 and the power receiver side 20 can be detected. The coupling nodes include the supplier power node NBS, the supplier communication node CCS, the receiver power node NBR, and the receiver communication node CCR.

In one embodiment, the power system 200 can be one which is compliant to for example the USB PD (Universal Serial Bus Power Delivery) specification. The supplier communication node CCS, the receiver communication node CCR and the communication signal CC correspond to the Configuration Channel (CC) defined in the USB PD specification. In one embodiment, the communication signal CC is used to determine whether the power supplier side 10 and the power receiver side 20 are properly coupled with each other, or to communicate information such as electrical characteristics of the voltage or the current of the power between the power supplier side 10 and the power receiver side 20. Certainly, the above are examples but not for limiting the scope of the present invention.

As shown in FIG. 4, according to the present invention, a foreign object existing between the plural coupling nodes between the power supplier side 10 and the power receiver side 20 can be detected. In one embodiment, when a foreign object existing between the coupling nodes is determined, the power system 200 can issue an alarm, or stop providing power from the power supplier side 10 to the power receiver side 20. In other embodiments, the power system can adaptively lower the level of the transmission current Ic provided from the power supplier side 10 through the supplier communication node CCS to the power receiver side 20. Certainly, in normal condition when there is no foreign object, the power system 200 can transmit power to the power receiver side 20 from the power supplier side 10.

As shown in FIG. 2, in one embodiment, the power supplier side 10 is for example but not limited to a power supply, and the power receiver side 20 is for example but not limited to an electronic device. The power supply includes a power control switch 11, a power control circuit 12, and a pull-up circuit 13.

The power control switch 11 provides the supply voltage VBUS to the power receiver side 20 according to the power control signal SC. In one embodiment, when the power supplier side 10 and the power receiver side 20 confirm with each other the coupling states and the required power electrical characteristics through the communication signal CC, the power control signal SC controls the power control switch 11 to be ON to conduct the supply voltage VBUS provided on the supplier power node NBS to the receiver power node NBR, so as to provide the supply voltage VBUS to the power receiver side 20.

The power control circuit 12, on one hand, generates the power control signal SC for controlling the power control switch 11, and on the other hand, the power control circuit 12 also generates a transmission control signal CTL according to a supplier transmission voltage Vccs at the supplier communication node CCS of the power supplier side 10, for determining whether a foreign object exists between the coupling nodes (which will be explained in detail with reference to FIGS. 4 and 5).

The pull-up circuit 13 adaptively adjusts the level of the transmission current Ic supplied from the supplier communication node CCS to the power receiver side 20, and the transmission current Ic generates the supplier transmission voltage Vccs according to the pull-down resistor Rd (which will be explained in detail with reference to FIG. 5).

Figure 3A:
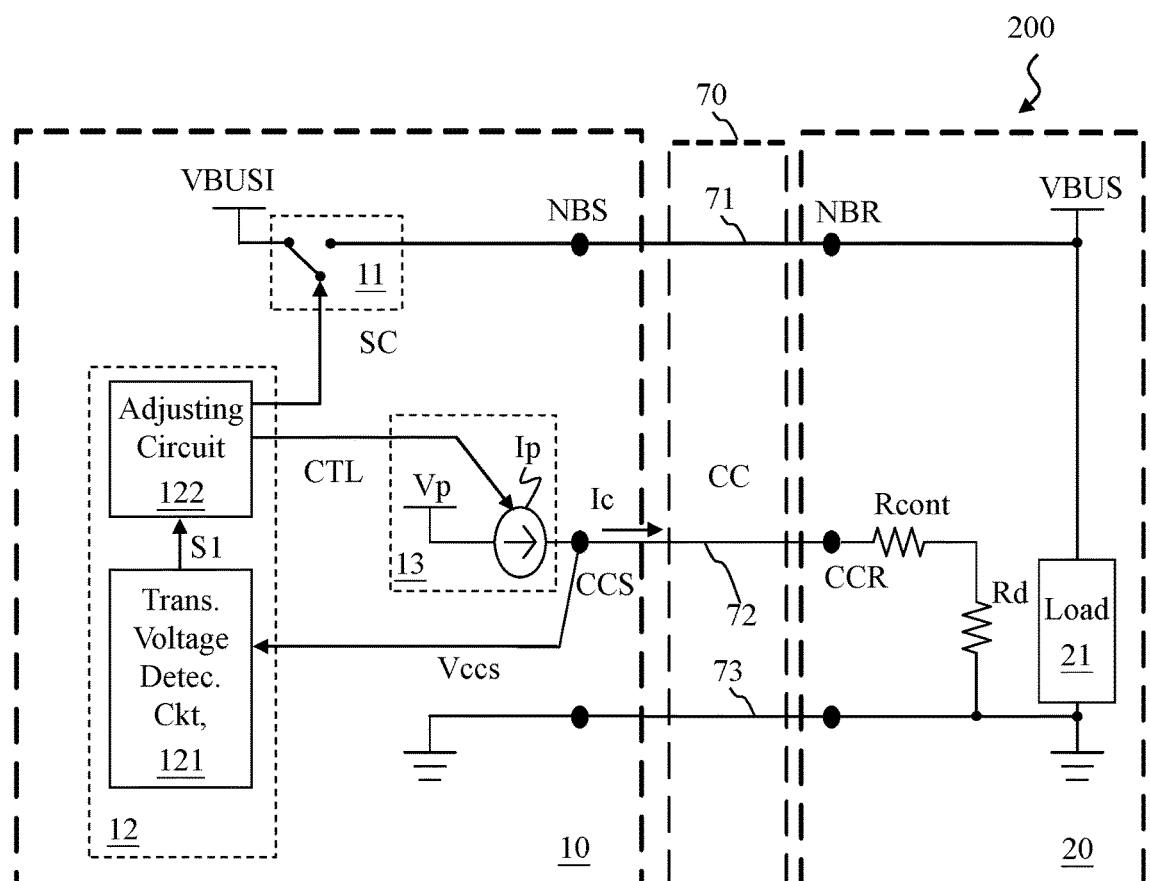
FIGS. 3A-3B show specific embodiments of power control circuits and pull-up circuits according to the present invention.
Figure 3B:
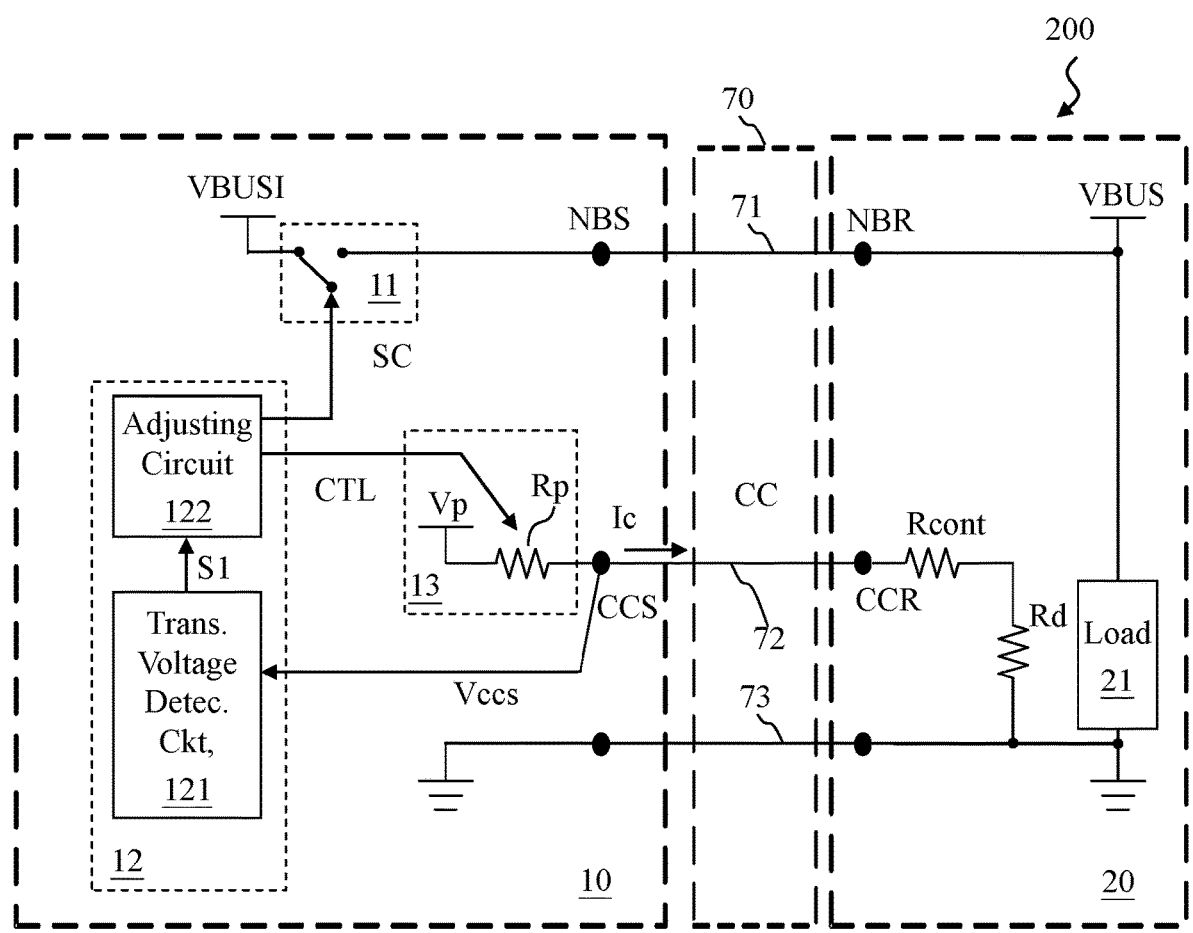

FIGS. 3A-3B show specific embodiments of power control circuits and pull-up circuits according to the present invention.

As shown in FIG. 3A, the power control circuit 12 includes a transmission voltage detection circuit 121 (Trans. Voltage Detec. Ckt. 121) and an adjusting circuit 122. The transmission voltage detection circuit 121 detects the supplier transmission voltage Vccs of the power supplier side 10 to generate the supplier transmission voltage level signal S1. The adjusting circuit 122 generates the power control signal SC and the transmission control signal CTL.

As shown in FIG. 3A, in one embodiment, the pull-up circuit 13 includes a pull-up voltage source Vp and a pull-up current source Ip. The pull-up voltage source Vp provides the pull-up voltage, and the pull-up current source Ip adaptively adjusts the level of the transmission current Ic supplied from the supplier communication node CCS from the power supplier side 10 to the power receiver side 20 according to the transmission control signal CTL.

As shown in FIG. 3B, in this embodiment, the pull-up circuit 13 includes a pull-up voltage source Vp and a pull-up resistor Rp. The pull-up voltage source Vp provides the pull-up voltage, and the resistance of the pull-up resistor Rp is adaptively adjusted according to the transmission control signal CTL to adjust the level of the transmission current Ic supplied from the supplier communication node CCS from the power supplier side 10 to the power receiver side 20.

In these embodiments, the power receiver side 20 for example is an electronic device which includes a load 21. When the power supplier side 10 and the electronic device (power receiver side 20) are coupled to each other through the cable 70, the power transmission lines 71 and 73 form a loop and thus are capable of delivering power, that is, the power control switch 11 in the power supplier side 10 supplies the supply voltage VBUS to the load 21 in the power receiver side 20.

How the power control circuit 12 generates the transmission control signal CTL according to the supplier transmission voltage Vccs at the supplier communication node CCS to determine whether a foreign object exists between the coupling nodes, is now explained below.

FIG. 4 shows a process flow of an embodiment of a foreign object detection method according to the present invention.

In this embodiment, as shown in step (S200) in FIG. 4, the pull-up circuit 13 provides a first current to the power receiver side 20 through the supplier communication node CCS at the power supplier side 10. More specifically, in step (S200), the power control circuit 12 adjusts the level of the transmission current Ic to a first current level (corresponding to the first current) to generate the supplier transmission voltage Vccs according to the pull-down resistor Rd on the supplier communication node CCS. Whether the power supplier side 10 and the power receiver side 20 are properly coupled with each other can be determined according to the supplier transmission voltage Vccs. In one embodiment, the first current level can be, for example but not limited to, 330 μA.

Next, in step (S300), the power control circuit 12 controls the power control switch 11 to be ON to provide a supply voltage VBUS to the supplier power node NBS, and whether a foreign object exists between the coupling nodes is determined according to a voltage difference of the supplier transmission voltage Vccs before and after the supply voltage VBUS is provided, or whether a foreign object exists between the coupling nodes is determined according to a voltage difference of the supplier transmission voltage Vccs before and after the supply voltage VBUS is stopped being provided.

Figure 1A:
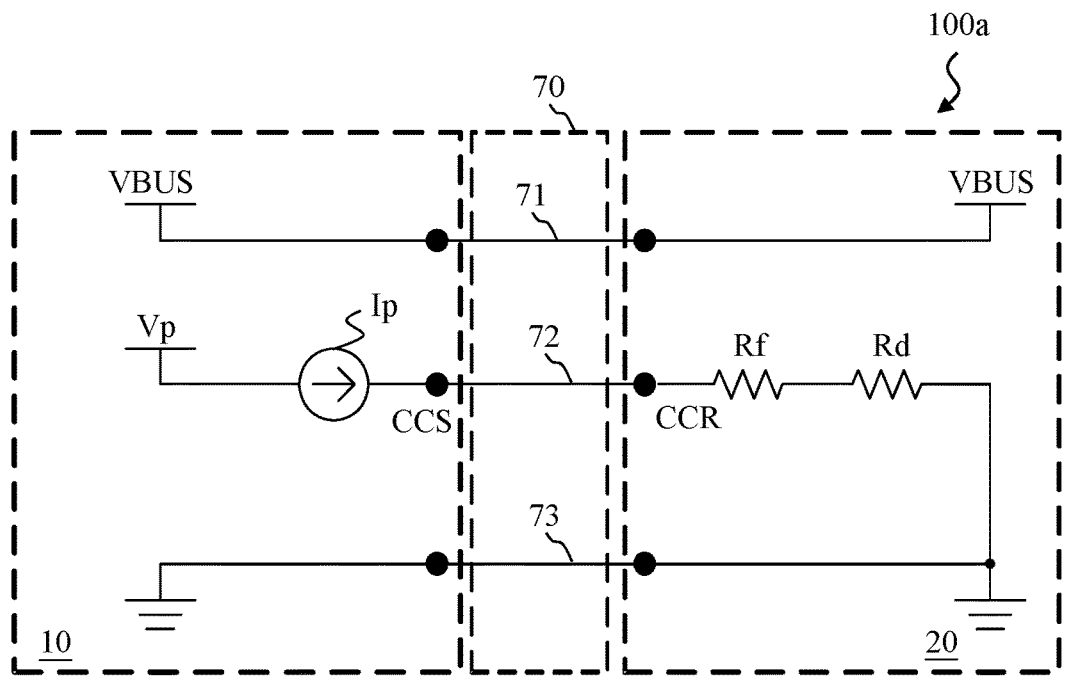
FIGS. 1A-1C show prior art power systems with possible problems.
Figure 1B:
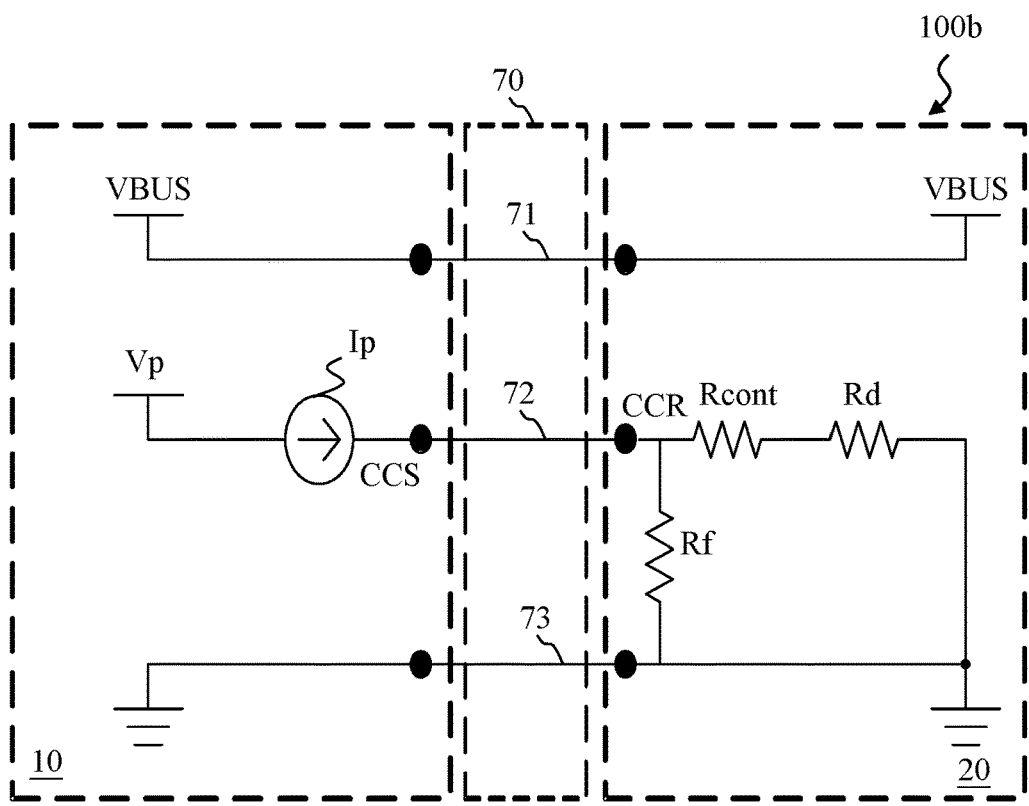
Figure 1C:
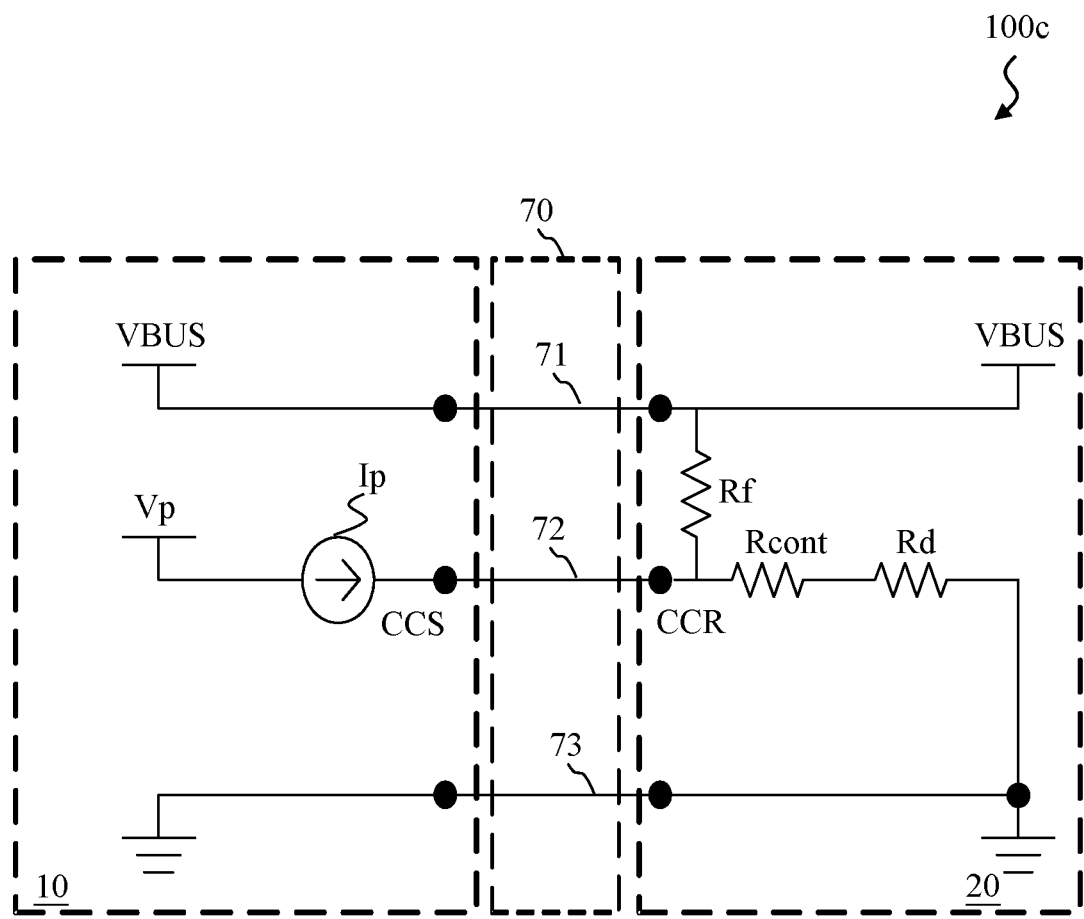

Referring back to FIG. 1C, if there is no foreign object between the power transmission line 71 and the signal transmission line 72 (i.e. Rf does not exist or is open) and under the condition that the level of the transmission current Ic keeps unchanged (e.g. at the first current level), the voltage difference of the supplier transmission voltage Vccs, before and after the supply voltage VBUS is provided at the power supplier side 10 through the supplier power node NBS, will keep the same. On the other hand, if there is a foreign object between the power transmission line 71 and the signal transmission line 72 (i.e. Rf exists or has limited resistance), the voltage difference of the supplier transmission voltage Vccs, before and after the supply voltage VBUS is provided at the power supplier side 10 through the supplier power node NBS, will change, which is due to the existence of the equivalent resistance Rf and the change of VBUS. More specifically, when there is a foreign object exists between the coupling nodes, the supplier transmission voltage Vccs will be raised as the supply voltage VBUS is provided (i.e. lower before and higher after the power control switch 11 in FIG. 2 is controlled to be ON), or, the supplier transmission voltage Vccs will be lowered as the supply voltage VBUS is stopped being provided (i.e. higher before and lower after the power control switch 11 in FIG. 2 is controlled to be OFF). Note that, "before the supply voltage VBUS is provided at the power supplier side 10 through the supplier power node NBS" and "after the supply voltage VBUS is stopped being provided" indicate a situation that the power control switch 11 is OFF and does not provide the supply voltage VBUS to the receiver side 20, and "after the supply voltage VBUS is provided at the power supplier side 10 through the supplier power node NBS" and "before the supply voltage VBUS is stopped being provided" indicate a situation that the power control switch 11 is controlled to be ON to provide the supply voltage VBUS to the receiver side 20.

Still referring to FIG. 4, in one embodiment, a step (S400) can be performed after the step (S300): when the step (S300) determines that a foreign object exists between the coupling nodes, performing a protection operation. The protection operation will be explained in detail later.

Figure 5:
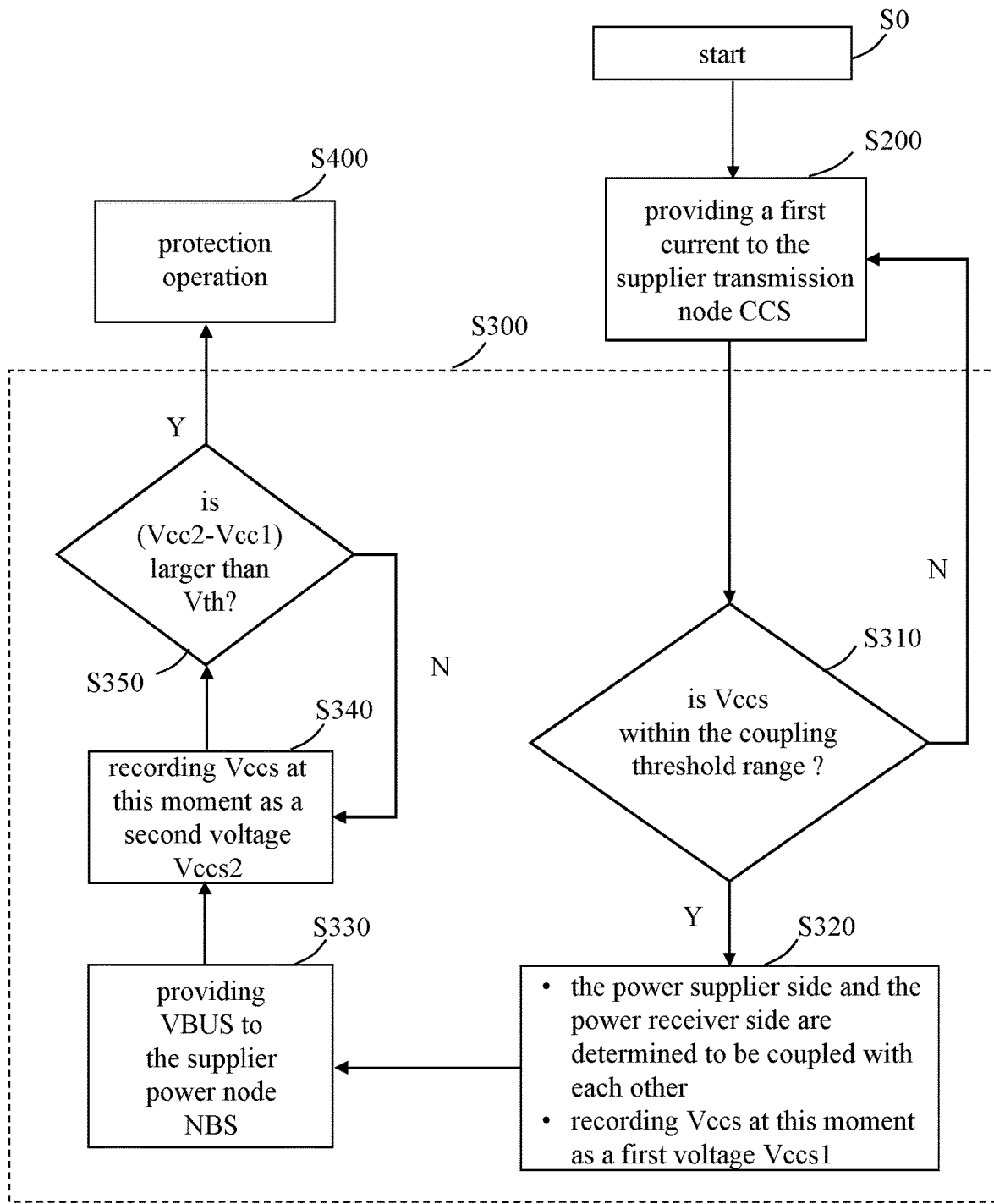
FIG. 5 shows a process flow of a specific embodiment of a foreign object detection method according to the present invention.
Figure 6:
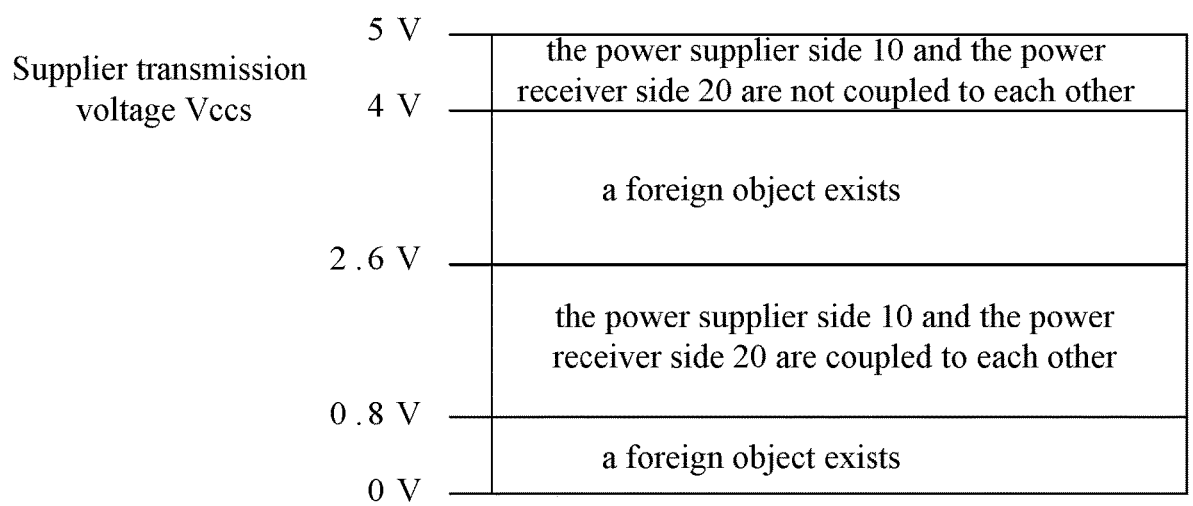
FIG. 6 shows an embodiment of a voltage range of a supplier communication node with corresponding determination results according to the present invention.

FIG. 5 shows a process flow of a specific embodiment of a foreign object detection method according to the present invention. FIG. 6 shows an embodiment of a voltage range of a supplier communication node with corresponding determination results according to the present invention. As shown in FIG. 5, in one embodiment, the step (S300) includes:

Step (S310): determining whether the power supplier side 10 and the power receiver side 20 are properly coupled with each other according to the supplier transmission voltage Vccs. For example in a power system compliant to USB PD specification, under the condition that the first current level is set to 330 μA, it can be determined whether the power supplier side 10 and the power receiver side 20 are properly coupled with each other according to whether the supplier transmission voltage Vccs is between 0.8V and 2.6V (as shown in FIG. 6, corresponding to the "coupling threshold range" in S310 of FIG. 5). Certainly, the exemplary numbers given above are for illustration only and not for limiting the scope of the present invention.

Next, when the step (S310) determines that the power supplier side 10 and the power receiver side 20 are properly coupled with each other, that is, when the supplier transmission voltage Vccs is within the coupling threshold range (for example between 0.8V and 2.6V), step (S320) is performed. The step (S320) includes: recording the supplier transmission voltage Vccs at this moment (when the power control switch is still OFF) as a first voltage Vccs1, and entering step (S330). The step (S330) includes: providing the supply voltage VBUS to the supplier power node NBS (e.g. by controlling the power control switch to be ON), and entering step (S340). The step (S340) includes: recording the supplier transmission voltage Vccs at this moment (when the power control switch is still ON) as a second voltage Vccs2, and entering step (S350). The step (S350) includes: determining whether a foreign object exists between the coupling nodes by determining whether a voltage difference between the second voltage Vccs2 and the first voltage Vccs1 is larger than a difference threshold Vth. In one embodiment, when the voltage difference between the second voltage Vccs2 and the first voltage Vccs1 is larger than the difference threshold Vth, it is determined that a foreign object exists between the coupling nodes. When the step (S350) determines that a foreign object exists between the coupling nodes, the step (S400) is performed, otherwise, the process returns to the step (S340).

On the other hand, when the step (S310) determines that the power supplier side 10 and the power receiver side 20 are not properly coupled with each other, that is, when the supplier transmission voltage Vccs is not within the coupling threshold range (for example, when the supplier transmission voltage Vccs is outside the range between 0.8V and 2.6V), the process returns to step (S200). Note that the term "not properly coupled" means that the electrical connection between the power supplier side 10 and the power receiver side 20 is determined to be open or exceed a certain extreme resistance (such as 4 M ohm) by the power control circuit 12 according to the supplier transmission voltage Vccs.

Note that, in the previous embodiment, 330 μA corresponds to the current specification in the USB PD for the CC pin. In other embodiments, the level of the transmission current Ic can be other numbers such as 180 μA or 80 μA, and certainly the number can be selected to meet other specifications. Note that the range 0.8V~2.6V can be modified as required. In other embodiments, the range can be set to correspond to other thresholds defined in the USB PD specification for the CC pin, such as 0.4V~1.6V or 0.2V~1.6V. Certainly, the numbers can be set to correspond to other specifications.

Figure 7:
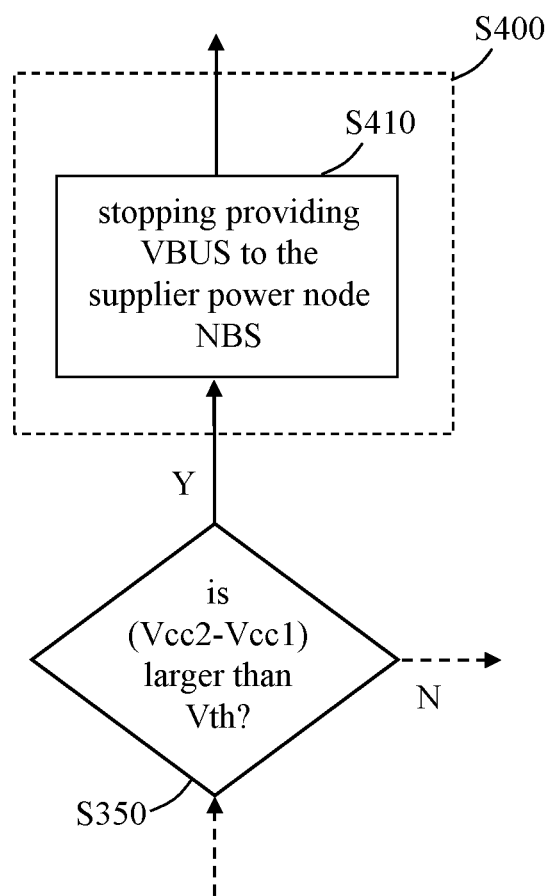
FIG. 7 shows a process flow of an embodiment of a foreign object detection method according to the present invention.

The aforementioned protection operation—i.e. the step (S400)—can be embodied in various ways. FIG. 7 shows a process flow of an embodiment of a foreign object detection method according to the present invention. In this embodiment, the protection operation includes step (S410). The step (S410) includes: stopping providing the supply voltage VBUS to the supplier power node NBS (for example by controlling the power control switch 11 to be OFF by the power control circuit 12). When it is determined that a foreign object exists, the power system can be prevented from being damaged by stopping providing the supply voltage VBUS.

Figure 8:
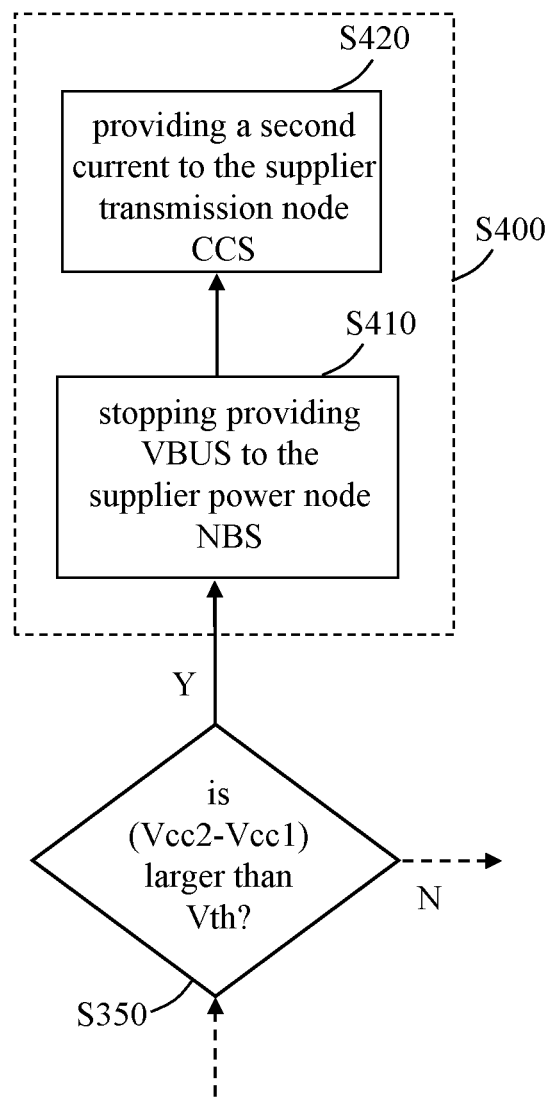
FIG. 8 shows a process flow of an embodiment of a foreign object detection method according to the present invention.

FIG. 8 shows a process flow of an embodiment of a foreign object detection method according to the present invention. In this embodiment, the protection operation (i.e. step S400) further includes step (S420). The step (S420) includes: providing a second current to the supplier communication node CCS by the pull-up circuit 13. More specifically, in the step (S420), the power control circuit 12 adjusts an average current level of the transmission current Ic to a second current level (corresponding to the second current), wherein the second current level is smaller than the first current level. When a foreign object such as moisture or other electrolyte exists, a lower current level of the transmission current Ic can slow down the rusting rate at the power supplier side 10, the power receiver side 20 and the cable 70.

There are various embodiments for adjusting the average current level of the transmission current Ic to a second current level. In one embodiment, the transmission current Ic is configured to be a constant current when the transmission current Ic is adjusted to the second current level. In another embodiment, the transmission current Ic is configured to be a pulsating current when the transmission current Ic is adjusted to the second current level.

Figure 9:
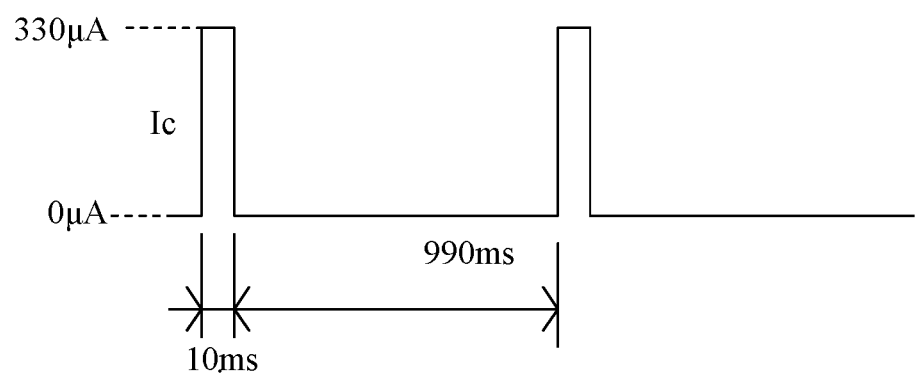
FIG. 9 shows an embodiment of a pulsating current according to the present invention.

FIG. 9 shows the embodiment that the transmission current Ic is configured to be a pulsating current when the transmission current Ic is adjusted to the second current level. As shown in FIG. 9, as an example, the transmission current Ic supplied by the pull-up circuit 13 from the supplier communication node CCS to the power receiver side 20 lasts for only 10 ms, and stops for 990 ms, as one cycle period. In this case, the total charges or the average current supplied by the pull-up circuit 13 from the supplier communication node CCS to the power receiver side 20 is lower than the high current 330 µA, and this is also capable of effectively avoiding damaging or rusting the power receiver side 20.

Figure 10:
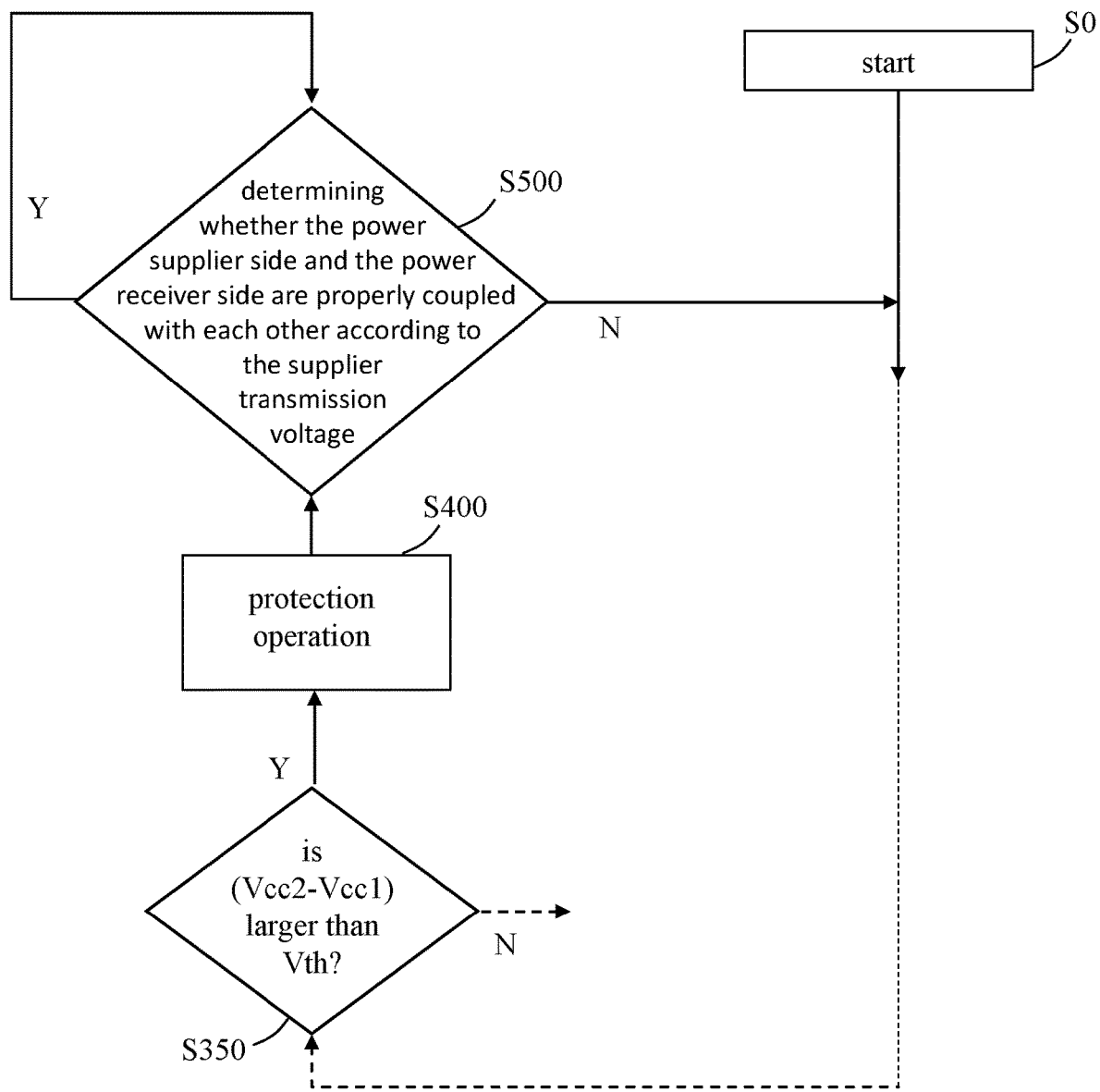
FIG. 10 shows a process flow of an embodiment of a foreign object detection method according to the present invention.

FIG. 10 shows a process flow of an embodiment of a foreign object detection method according to the present invention. As shown in FIG. 10, in this embodiment, after the protection operation, i.e. the step (S400), a step (S500) can be performed to control the power system 200. In the step (S500), the power control circuit 12 can determine again whether the power supplier side 10 and the power receiver side 20 are properly coupled with each other according to the supplier transmission voltage Vccs. When the step (S500) determines that the power supplier side 10 and the power receiver side 20 are properly coupled with each other, the step (S500) will be repeated; or when the step (S500) determines that the power supplier side 10 and the power receiver side 20 are not properly coupled with each other, the process can return to the step (S200) or a step before the step (S200), i.e., a step after the start step (S0) and before the step (S200), which for example is the step (S100) which will be explained later.

Figure 11:
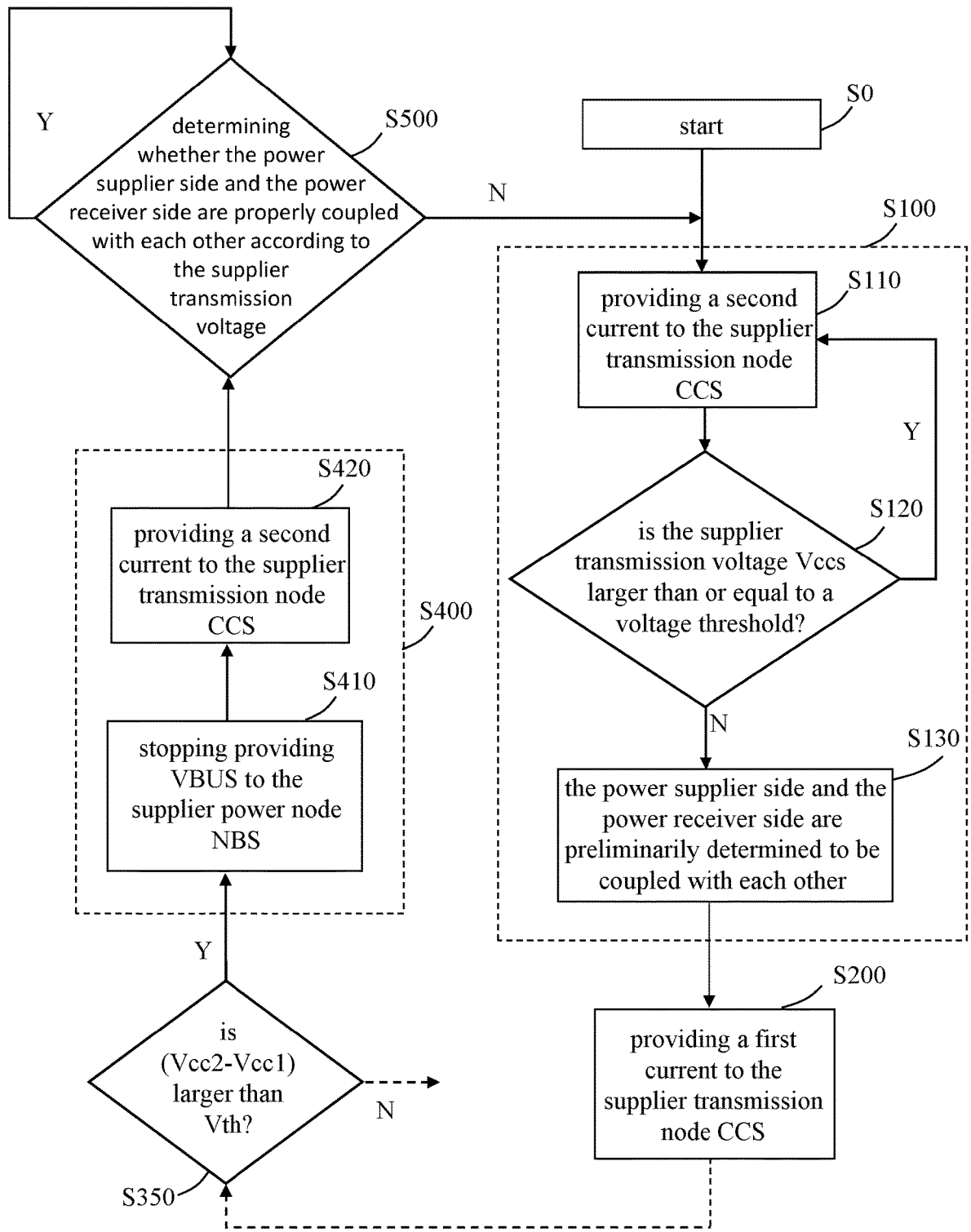
FIG. 11 shows a process flow of an embodiment of a foreign object detection method according to the present invention.

FIG. 11 shows a process flow of an embodiment of a foreign object detection method according to the present invention. In one specific embodiment, as shown in FIG. 11, in the case where the protection operation (i.e. the step (S400)) includes the step (S420) (i.e. the average current level of the transmission current Ic is adjusted to the second current level), the power control circuit 12 further includes step (S100) to control the power system 200. The step (S100) includes: providing the second current, and preliminarily determining whether the power supplier side 10 and the power receiver side 20 are properly coupled with each other according to the supplier transmission voltage Vccs. When it is preliminarily determined that the power supplier side 10 and the power receiver side 20 are properly coupled with each other, the step (S200) will be performed; otherwise, the step (S100) will be repeated.

Still referring to FIG. 11, in one specific embodiment, the step (S100) includes steps (S110), (S120) and (S130). The step (S110) can be performed after the step "start"—i.e. step (S0). In the step (S110), the power control circuit 12 adjusts the average current level of the transmission current Ic to a second current level. Next in the step (S120), it is preliminarily determined whether the power supplier side 10 and the power receiver side 20 are properly coupled with each other according to the supplier transmission voltage Vccs. Also referring to FIG. 6, for example in a power system compliant to the USB PD specification wherein the second current level is configured to be 1 µA, it can be preliminarily determined whether the power supplier side 10 and the power receiver side 20 are properly coupled with each other according to whether the supplier transmission voltage Vccs is larger than or equal to 4V; note that the numbers given above are for illustration only and not for limiting the scope of the present invention. If a foreign object indeed exists, a lower second current level provided to the supplier communication node CCS to generate the supplier transmission voltage Vccs for determining whether the power supplier side 10 and the power receiver side 20 are properly coupled with each other can effectively avoid damaging the circuitry or causing rusting. Also note that, in this case, the voltage threshold corresponding to the second current level for determining whether the power supplier side 10 and the power receiver side 20 are properly coupled with each other is different from the voltage threshold corresponding to the first current level (for example Vccs <4V instead of between 0.8V~2.6V).

Still referring to FIG. 11, when it is preliminarily determined that the power supplier side 10 and the power receiver side 20 are properly coupled with each other in the step (S130), the step (S200) will be performed, otherwise, the step (S120) will be repeated.

Figure 12A:
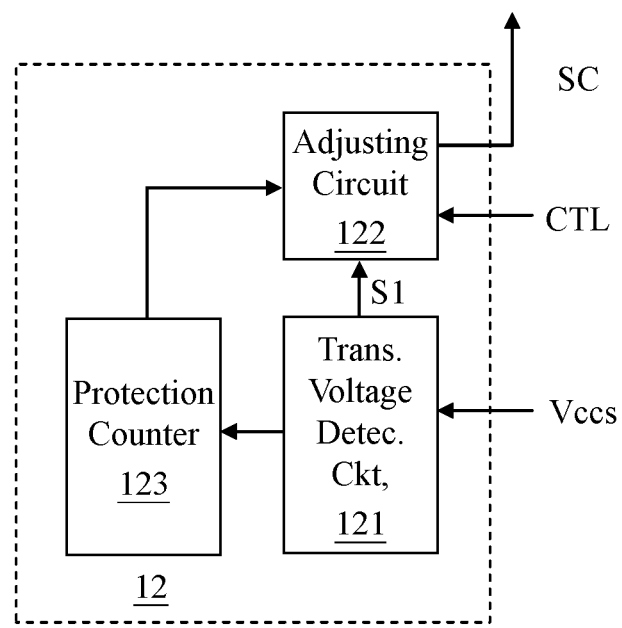
FIG. 12A shows a specific embodiment of a power control circuit according to the present invention.
Figure 12B:
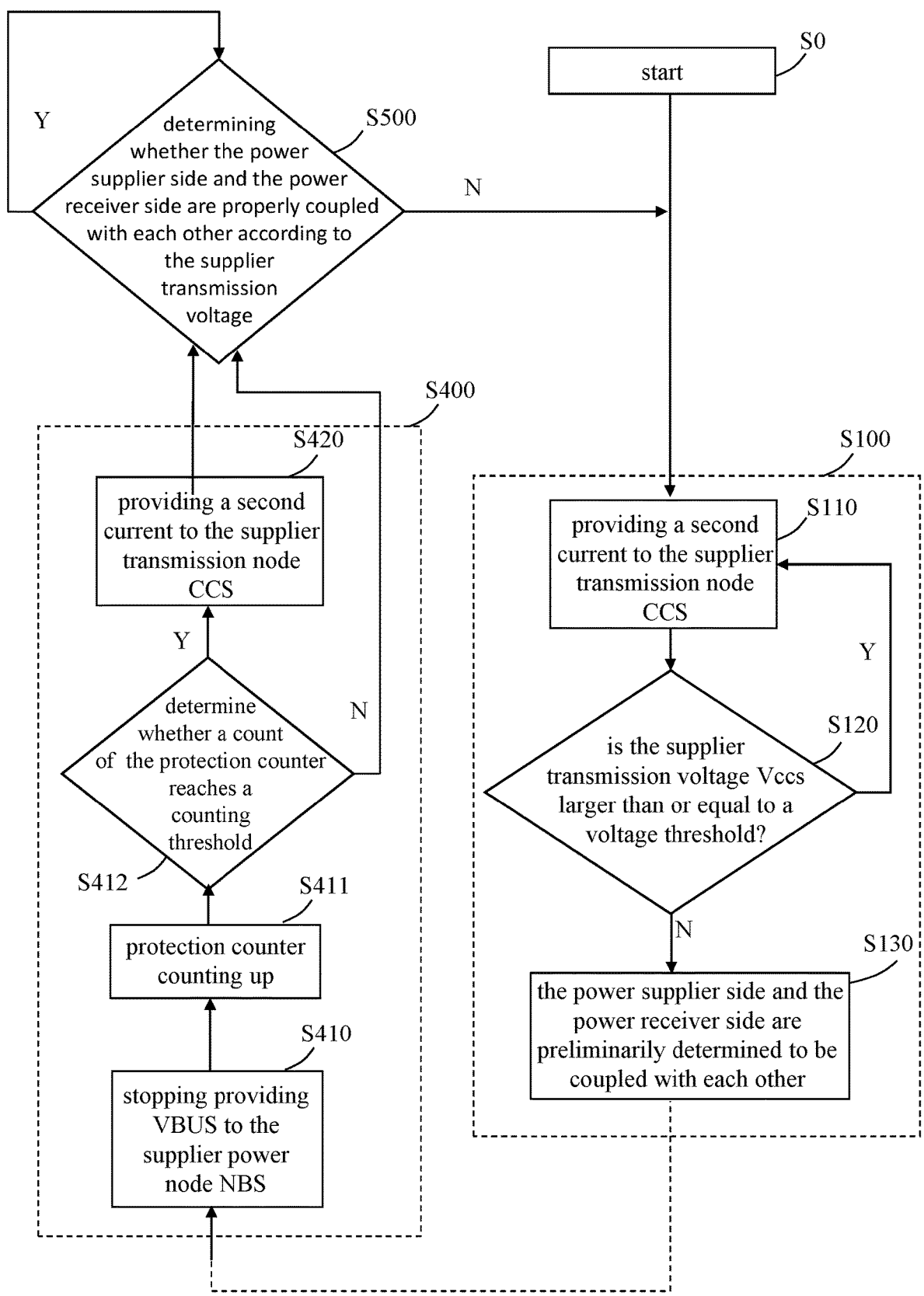
FIG. 12B shows a process flow of an embodiment of a foreign object detection method according to the present invention.

FIG. 12A shows a specific embodiment of a power control circuit according to the present invention. FIG. 12B shows a process flow of an embodiment of a foreign object detection method according to the present invention. As shown in FIG. 12A, in this embodiment, the power control circuit 12 further includes a protection counter 123. Also referring to FIG. 12B, the step (S400) further includes steps (S411) and (S412). In the step (S411), when the step (S300) determines that a foreign object exists between the coupling nodes, the protection counter 123 is controlled to start counting (in this embodiment, to count up); and the step (S412) is performed. In the step (S412), when a count of the protection counter 123 reaches a counting threshold, the step (S420) is performed, otherwise the step (S500) is performed. More specifically, when the count of the protection counter 123 has not reached the counting threshold, the power system 200 can repeat the steps above for several times to confirm whether a foreign object exists. The protection counter 123 along with the corresponding counting threshold can avoid misjudgment as to whether a foreign object exists.

The present invention has been described in considerable detail with reference to certain preferred embodiments thereof. It should be understood that the description is for illustrative purpose, not for limiting the scope of the present invention. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. Furthermore, those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. The spirit of the present invention should cover all such and other modifications and variations, which should be interpreted to fall within the scope of the following claims and their equivalents.

What is claimed is:

1. A foreign object detection method for detecting whether a foreign object exists at or between coupling nodes of a power supplier side and a power receiver side, wherein the power supplier side and the power receiver side are configured to be coupled with each other through a cable which includes a power transmission line and a signal transmission line, the power supplier side having a supplier power node and a supplier communication node and the power receiver side having a receiver power node and a receiver communication node, wherein the power transmission line is configured to transmit power between the supplier power node and the receiver power node, and the signal transmission line is configured to transmit a communication signal between the supplier communication node and the receiver communication node, the supplier communication node having a supplier transmission voltage, and the power receiver side including a pull-down resistor coupled to the receiver communication node, wherein the coupling nodes includes the supplier power node, the supplier communication node, the receiver power node, and the receiver communication node; the method comprising:

step (S200) providing a first current to the supplier communication node to generate the supplier transmission voltage according to the pull-down resistor; and step (S300) wherein whether the power supplier side and the power receiver side are properly coupled with each other is determined according to the supplier transmission voltage, providing a supply voltage to the supplier power node; and determining whether the foreign object exists between the coupling nodes according to a voltage difference of the supplier transmission voltage before and after the supply voltage is provided, or determining whether the foreign object exists between the coupling nodes according to the voltage difference of the supplier transmission voltage before and after the supply voltage is stopped being provided.

2. The foreign object detection method of claim 1, further comprising:

step (S400) when the step (S300) determines that the foreign object exists between the coupling nodes, performing a protection operation.

3. The foreign object detection method of claim 2, wherein the step (S400) includes:

(S410) stopping providing the supply voltage to the supplier power node.

4. The foreign object detection method of claim 3, wherein the step (S400) further includes:

step (S420) providing a second current to the supplier communication node, wherein an average current level of the second current is smaller than a level of the first current.

5. The foreign object detection method of claim 4, wherein the second current is a constant current.

6. The foreign object detection method of claim 4, wherein the second current is a pulsating current.

7. The foreign object detection method of claim 4, wherein the first current and/or the second current are/is provided via a pull-up current source or a pull-up resistor of the power supplier side.

8. The foreign object detection method of claim 4, further comprising:

step (S500) after the step (S400), determining whether the power supplier side and the power receiver side are properly coupled with each other according to the supplier transmission voltage; and when the step (S500) determines that the power supplier side and the power receiver side are properly coupled with each other, repeating the step (S500), or when the step (S500) determines that the power supplier side and the power receiver side are not properly coupled with each other, returning to the step (S200) or a step before the step (S200).

9. The foreign object detection method of claim 4, wherein the step (S400) further includes:

step (S411) configuring a protection counter, wherein when the step (S300) determines that the foreign object exists between the coupling nodes, the protection counter starts counting; and step (S412) when a count of the protection counter reaches a counting threshold, entering the step (S420) providing the second current to the supplier communication node, otherwise entering the step (S500) determining whether the power supplier side and the power receiver side are properly coupled with each other according to the supplier transmission voltage.

10. The foreign object detection method of claim 1, wherein the step (S300) includes:

when the supplier transmission voltage is raised as the supply voltage is provided, determining that the foreign object exists between the coupling nodes; or when the supplier transmission voltage is lowered as the supply voltage is stopped being provided, determining that the foreign object exists between the coupling nodes.

11. The foreign object detection method of claim 1, wherein the step (S300) includes:

step (S310) determining whether the power supplier side and the power receiver side are properly coupled with each other according to the supplier transmission voltage;

step (S320) when the step (S310) determines that the power supplier side and the power receiver side are properly coupled with each other, recording the supplier transmission voltage at this moment as a first voltage, and entering step (S330);

the step (S330) providing the supply voltage to the supplier power node, and entering step (S340);

the step (S340) recording the supplier transmission voltage at this moment as a second voltage, and entering step (S350); and the step (S350) determining whether the foreign object exists between the coupling nodes by determining whether a voltage difference between the second voltage and the first voltage is larger than a difference threshold.

12. The foreign object detection method of claim 1, wherein the first current is provided via a pull-up current source or a pull-up resistor of the power supplier side.

13. A power system capable of detecting foreign object, comprising:

a power supplier side and a power receiver side which are configured to be coupled with each other through a cable which includes a power transmission line and a signal transmission line, the power supplier side having a supplier power node and a supplier communication node and the power receiver side having a receiver power node and a receiver communication node, a wherein the power transmission line is configured to transmit power between the supplier power node and the receiver power node, and the signal transmission line is configured to transmit a communication signal between the supplier communication node and the receiver communication node, the supplier communication node having a supplier transmission voltage, and the power receiver side including a pull-down resistor coupled to the receiver communication node, wherein the coupling nodes includes the supplier power node, the supplier communication node, the receiver power node, and the receiver communication node; the power supplier side including:

a power control switch, configured to operably provide a supply voltage to the power receiver side according to a power control signal;

a pull-up circuit, configured to adaptively adjust a level of a transmission current provided from the supplier communication node to the power receiver side according to a transmission control signal; and a power control circuit, configured to operably generate the power control signal to control the power control switch and generate the transmission control signal to control the pull-up circuit, wherein the power control circuit controls the power system according to the following steps:

step (S200) controlling the level of the transmission current to a first current level to generate the supplier transmission voltage on the supplier communication node according to the pull-down resistor; and step (S300) wherein whether the power supplier side and the power receiver side are properly coupled with each other is determined according to the supplier transmission voltage, providing the supply voltage to the supplier power node; and determining whether the foreign object exists between the coupling nodes according to a voltage difference of the supplier transmission voltage before and after the supply voltage is provided, or determining whether the foreign object exists between the coupling nodes according to the voltage difference of the supplier transmission voltage before and after the supply voltage is stopped being provided.

14. The power system of claim 13, the power control circuit further controlling the power system according to the following steps:

step (S400) when the step (S300) determines that the foreign object exists between the coupling nodes, performing a protection operation.

15. The power system of claim 14, wherein the step (S400) includes:

step (S410) stopping providing the supply voltage to the supplier power node.

16. The power system of claim 15, wherein the step (S400) further includes:

step (S420) controlling an average current level of the transmission current to a second current level, wherein the second current level is smaller than the first current level.

17. The power system of claim 16, wherein when controlling the average current level of the transmission current to the second current level, the transmission current is a constant current.

18. The power system of claim 16, wherein when controlling the average current level of the transmission current to the second current level, the transmission current is a pulsating current.

19. The power system of claim 16, the power control circuit further controlling the power system according to the following steps:

step (S500) after the step (S400), determining whether the power supplier side and the power receiver side are properly coupled with each other according to the supplier transmission voltage; and when the step (S500) determines that the power supplier side and the power receiver side are properly coupled with each other, repeating the step (S500), or when the step (S500) determines that the power supplier side and the power receiver side are not properly coupled with each other, returning to the step (S200) or a step before the step (S200).

20. The power system of claim 16, the power control circuit including a protection counter, the step (S400) further including:

step (S411) when the step (S300) determines that the foreign object exists between the coupling nodes, the protection counter starting counting; and step (S412) when a count of the protection counter reaches a counting threshold, entering the step (S420) providing the second current to the supplier communication node, otherwise entering the step (S500) determining whether the power supplier side and the power receiver side are properly coupled with each other according to the supplier transmission voltage.

21. The power system of claim 13, wherein the step (S300) includes:

when the supplier transmission voltage is raised as the supply voltage is provided, determining that the foreign object exists between the coupling nodes; or when the supplier transmission voltage is lowered as the supply voltage is stopped being provided, determining that the foreign object exists between the coupling nodes.

22. The power system of claim 21, wherein the step (S300) includes:

step (S310) determining whether the power supplier side and the power receiver side are properly coupled with each other according to the supplier transmission voltage;

step (S320) when the step (S310) determines that the power supplier side and the power receiver side are properly coupled with each other, recording the supplier transmission voltage at this moment as a first voltage, and entering step (S330);

the step (S330) providing the supply voltage to the supplier power node, and entering step (S340);

the step (S340) recording the supplier transmission voltage at this moment as a second voltage, and entering step (S350); and the step (S350) determining whether the foreign object exists between the coupling nodes by determining whether a voltage difference between the second voltage and the first voltage is larger than a difference threshold.

23. The power system of claim 13, wherein the transmission current is provided via a pull-up current source or a pull-up resistor of the power supplier side.

* * * * *